(12) United States Patent
Qian et al.

(10) Patent No.: US 11,367,469 B2
(45) Date of Patent: Jun. 21, 2022

(54) SHIFT REGISTER UNIT CIRCUIT AND DRIVING METHOD, SHIFT REGISTER, GATE DRIVE CIRCUIT, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Xianrui Qian, Beijing (CN); Guolei Wang, Beijing (CN); Tong Yang, Beijing (CN); Suzhen Mu, Beijing (CN); Peng Chen, Beijing (CN); Yuting Chen, Beijing (CN); Zixuan Wang, Beijing (CN); Bo Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 463 days.

(21) Appl. No.: 15/766,937

(22) PCT Filed: Oct. 9, 2017

(86) PCT No.: PCT/CN2017/105354
§ 371 (c)(1),
(2) Date: Apr. 9, 2018

(87) PCT Pub. No.: WO2018/077022
PCT Pub. Date: May 3, 2018

(65) Prior Publication Data
US 2020/0258554 A1    Aug. 13, 2020

(30) Foreign Application Priority Data

Oct. 27, 2016    (CN) .................. 201610957836.X

(51) Int. Cl.
*G11C 19/00*    (2006.01)
*G11C 7/10*    (2006.01)
(Continued)

(52) U.S. Cl.
CPC .......... *G11C 7/1036* (2013.01); *G11C 7/1051* (2013.01); *G11C 7/12* (2013.01);
(Continued)

(58) Field of Classification Search
None
See application file for complete search history.

(56) References Cited

U.S. PATENT DOCUMENTS 5,307,315 A *    4/1994    Oowaki .............. G11C 11/4085
                                                                365/189.09
8,582,385 B2 *    11/2013    Kim ...................... G11C 5/145
                                                                365/226
(Continued)

OTHER PUBLICATIONS

International Search Report and Written Opinion dated Jan. 15, 2018 in PCT/CN2017/105354.

*Primary Examiner* — Tuan T Lam
(74) *Attorney, Agent, or Firm* — Syncoda LLC; Feng Ma

(57) ABSTRACT

A shift register unit circuit includes an input sub-circuit, a pull-up sub-circuit, a pull-down control sub-circuit, a pull-down sub-circuit, and a voltage regulating sub-circuit. The input sub-circuit receives an input signal from a signal input terminal to control a potential of a pull-up node. The pull-up sub-circuit outputs a gate driving signal to an output terminal under control of the potential of the pull-up node and a signal from a first signal terminal. The pull-down control sub-circuit conducts a pull-down node with a first node
(Continued)

under control of a signal from the second signal terminal. The pull-down sub-circuit conducts the pull-up node with the first node and the turn-down signal terminal with the output terminal under control of a potential of the pull-down node. The voltage regulating sub-circuit conducts the first node with the turn-down signal terminal under control of a potential of the first node.

18 Claims, 5 Drawing Sheets

(51) Int. Cl.
  *G11C 7/12* (2006.01)
  *G11C 7/20* (2006.01)
  *G11C 7/22* (2006.01)
  *G11C 19/28* (2006.01)

(52) U.S. Cl.
  CPC .................. *G11C 7/20* (2013.01); *G11C 7/22* (2013.01); *G11C 19/28* (2013.01); *G09G 2310/0286* (2013.01)

(56) References Cited

U.S. PATENT DOCUMENTS

| | | |
|---|---|---|
| 9,203,395 B2 | 12/2015 | Kim et al. |
| 9,269,455 B2 | 2/2016 | Liu |
| 2010/0226473 A1* | 9/2010 | Liu .................. G11C 19/28 377/79 |
| 2011/0058640 A1* | 3/2011 | Shang ............... G11C 19/184 377/64 |
| 2011/0064186 A1* | 3/2011 | Koyama ............ G11C 19/28 377/79 |
| 2017/0039987 A1* | 2/2017 | Yao ..................... G09G 3/20 |
| 2017/0092375 A1* | 3/2017 | Xia .................... G09G 3/3677 |
| 2018/0187448 A1* | 7/2018 | Choi .................. E04H 15/64 |
| 2019/0245341 A1* | 8/2019 | Ma ..................... H03K 17/0822 |
| 2020/0135287 A1* | 4/2020 | Han .................... G09G 3/3266 |

\* cited by examiner

SHIFT REGISTER UNIT CIRCUIT AND DRIVING METHOD, SHIFT REGISTER, GATE DRIVE CIRCUIT, AND DISPLAY APPARATUS

CROSS-REFERENCE TO RELATED APPLICATION

The present application claims priority to Chinese Patent Application No. 201610957836.X filed on Oct. 27, 2016, the disclosure of which is hereby incorporated by reference in its entirety.

TECHNICAL FIELD

The present disclosure relates generally to a field of display technologies, and specifically to a shift register unit circuit, a shift register comprising the shift register unit circuit, a gate drive circuit comprising the shift register, and a display apparatus comprising the gate drive circuit.

BACKGROUND

A gate drive circuit of a display apparatus typically includes shift registers. A shift register comprises shift register unit circuits that are cascaded. When the output of a shift register unit circuit is completed, a pull-up node and a signal output terminal of the shift register unit circuit need to be discharged and reset.

During a pull-down stage, the low-level voltage outputted to a control terminal of a pull-down sub-circuit by a pull-down control sub-circuit is prone to be influenced by the output pull-down of the display area, which causes the voltage of the control terminal of the pull-down sub-circuit unstable, further negatively influencing the proper shutoff of gate lines.

SUMMARY

The purpose of the present disclosure is to provide a shift register unit circuit, a driving method thereof, a shift register comprising the shift register unit circuit, a gate drive circuit comprising the shift register, and a display apparatus comprising the gate drive circuit. The shift register as such aims to address the issues with current technologies, and has a stable voltage during the pull-down stage, which can ensure the proper shutoff of the gate lines.

In a first aspect, the present disclosure provides a shift register unit circuit.

According to a first embodiment of the disclosure, the shift register unit circuit comprises an input sub-circuit, a pull-up sub-circuit, a pull-down control sub-circuit, a pull-down sub-circuit, and a voltage regulating sub-circuit.

The input sub-circuit is coupled to a signal input terminal and a pull-up node, and is configured to receive an input signal from the signal input terminal to thereby control a potential of the pull-up node.

The pull-up sub-circuit is coupled to the pull-up node, a first signal terminal and an output terminal, and is configured to output a gate driving signal to the output terminal under control of the potential of the pull-up node and a signal inputted from the first signal terminal.

The pull-down control sub-circuit is coupled to a first node, a second signal terminal, and a pull-down node, and is configured to conduct the pull-down node with the first node under control of a signal inputted from the second signal terminal.

The pull-down sub-circuit is coupled to the pull-up node, the pull-down node, the first node, a turn-down signal terminal, and the output terminal, and is configured to conduct the pull-up node with the first node, and to conduct the turn-down signal terminal with the output terminal, under control of a potential of the pull-down node.

The voltage regulating sub-circuit is coupled to the first node and the turn-down signal terminal, and is configured to conduct the first node with the turn-down signal terminal under control of a potential of the first node.

According to a second embodiment of the disclosure, the shift register unit circuit further comprises a reset sub-circuit, which is coupled to a reset terminal, the pull-up node, the first node, the output terminal, and the turn-down signal terminal, and is configured to conduct the turn-down signal terminal with the output terminal and to conduct the first node with the pull-up node under control of a signal inputted from the reset terminal.

In any one of the first embodiment and the second embodiment of the shift register unit circuit as described above, the voltage regulating sub-circuit can include a voltage regulating transistor. It is configured such that a first electrode of the voltage regulating transistor is coupled to the turn-down signal terminal, and a second electrode and a gate electrode of the voltage regulating transistor are coupled to each other and are both coupled to the first node.

Herein a width-length ratio of a channel of the voltage regulating transistor can be configured to be larger than or equal to two.

In any one of the first embodiment and the second embodiment of the shift register unit circuit as described above, the voltage regulating sub-circuit can alternatively include a diode, configured such that an anode of the diode is coupled to the first node, and a cathode of the diode is coupled to the turn-down signal terminal.

In any one of the first embodiment and the second embodiment of the shift register unit circuit as described above, the input sub-circuit can comprise an input transistor having a gate electrode, a first electrode and a second electrode. It is configured such that the gate electrode and the first electrode of the input transistor are coupled to each other and are both coupled to the signal input terminal, and the second electrode of the input transistor is coupled to the pull-up node.

In any one of the first embodiment and the second embodiment of the shift register unit circuit as described above, the input sub-circuit can further comprise a filter transistor, configured such that a first electrode of the filter transistor is coupled to the first electrode of the input transistor; a second electrode of the filter transistor is coupled to the second electrode of the input transistor; and a gate electrode of the filter transistor is coupled to the second signal terminal.

In any one of the first embodiment and the second embodiment of the shift register unit circuit as described above, the pull-up sub-circuit can comprise a pull-up transistor and a storage unit. A gate electrode of the pull-up transistor is coupled to the pull-up node, a first electrode of the pull-up transistor is coupled to the first signal terminal, and a second electrode of the pull-up transistor is coupled to the output terminal. One terminal of the storage unit is coupled to the gate electrode of the pull-up transistor, and another terminal of the storage unit is coupled to the second electrode of the pull-up transistor.

Herein the storage unit can include a capacitor.

In any one of the first embodiment and the second embodiment of the shift register unit circuit as described above, the pull-down sub-circuit can include a first pull-down transistor and a second pull-down transistor.

It is configured such that a gate electrode of the first pull-down transistor is coupled to the pull-down node, a first electrode of the first pull-down transistor is coupled to the output terminal, and a second electrode of the first pull-down transistor is coupled to the turn-down signal terminal. It is further configured such that a gate electrode of the second pull-down transistor is coupled to the pull-down node, a first electrode of the second pull-down transistor is coupled to the pull-up node, and a second electrode of the second pull-down transistor is coupled to the first node.

In any one of the first embodiment and the second embodiment of the shift register unit circuit as described above, the pull-down sub-circuit can further include a third pull-down transistor. It is configured such that a gate electrode of the third pull-down transistor is coupled to the second signal terminal; a first electrode of the third pull-down transistor is coupled to the first electrode of the first pull-down transistor; and a second electrode of the third pull-down transistor is coupled to the second electrode of the first pull-down transistor.

In any one of the first embodiment and the second embodiment of the shift register unit circuit as described above, the pull-down control sub-circuit can include a first pull-down control transistor, a second pull-down control transistor, a third pull-down control transistor, and a fourth pull-down control transistor.

It is configured such that a gate electrode of the first pull-down control transistor is coupled to the second signal terminal, a first electrode of the first pull-down control transistor is coupled to the gate electrode of the first pull-down control transistor, and a second electrode of the first pull-down control transistor is coupled to a first electrode of the third pull-down control transistor.

It is further configured such that a gate electrode of the second pull-down control transistor is coupled to the second electrode of the first pull-down control transistor, a first electrode of the second pull-down control transistor is coupled to the first electrode of the first pull-down control transistor, and a second electrode of the second pull-down control transistor is coupled to the pull-down node.

It is further configured such that a gate electrode of the third pull-down control transistor is coupled to the pull-up node, and a second electrode of the third pull-down control transistor is coupled to the first node.

It is further configured such that a gate electrode of the fourth pull-down control transistor is coupled to the gate electrode of the third pull-down control transistor, a first electrode of the fourth pull-down control transistor is coupled to pull-down node, and a second electrode of the fourth pull-down control transistor is coupled to the first node.

In any one of the first embodiment and the second embodiment of the shift register unit circuit as described above, the reset sub-circuit can include a first reset transistor and a second reset transistor.

It is configured such that a first electrode of the first reset transistor is coupled to the output terminal, a second electrode of the first reset transistor is coupled to the turn-down signal terminal, and a gate electrode of the first reset transistor is coupled to the reset terminal.

It is further configured such that a gate electrode of the second reset transistor is coupled to the gate electrode of the first reset transistor, a first electrode of the second reset transistor is coupled to the pull-up node, and a second electrode of the second reset transistor is coupled to the first node.

In any one of the first embodiment and the second embodiment of the shift register unit circuit as described above, the first signal terminal is configured to provide a low-level signal during an input stage, a high-level signal during an output stage, and a low-level signal during a pull-down stage; the second signal terminal is configured to provide a high-level signal during the input stage, a low-level signal during the output stage, and a high-level signal during the pull-down stage; and the signal input terminal is configured to provide a high-level signal during the input stage, a low-level signal during the output stage, and a low-level signal during the pull-down stage.

In any one of the first embodiment and the second embodiment of the shift register unit circuit as described above, at least one of the first signal terminal and the second signal terminal can be a clock signal terminal.

In a second aspect, the present disclosure further provides a method for driving a shift register unit circuit according to any one embodiment as described above.

The method can comprise an input stage, an output stage, and a pull-down stage.

During the input stage, the first signal terminal provides a low-level signal, the second signal terminal provides a high-level signal, and the signal input terminal provides a high-level signal.

During the output stage, the first signal terminal provides a high-level signal, the second signal terminal provides a low-level signal, and the signal input terminal provides a low-level signal.

During the pull-down stage, the first signal terminal provides a low-level signal, the second signal terminal provides a high-level signal, and the signal input terminal provides a low-level signal.

In a third aspect, the present disclosure further provides a shift register. The shift register includes at least one shift register unit circuit, wherein one or more of the at least one shift register unit circuit can be the shift register unit circuit according to any one of the above-mentioned embodiments.

According to some embodiments of the shift register, the at least one shift register unit circuit is cascaded.

In a fourth aspect, the present disclosure further provides a gate drive circuit. The gate drive circuit comprises a shift register according to any one of the embodiments as described above.

In a fifth aspect, the present disclosure further provides a display apparatus.

The display apparatus comprises a gate drive circuit as described above.

BRIEF DESCRIPTION OF DRAWINGS

To more clearly illustrate some of the embodiments, the following is a brief description of the drawings.

The drawings in the following descriptions are only illustrative of some embodiments. For those of ordinary skill in the art, other drawings of other embodiments can become apparent based on these drawings.

DETAILED DESCRIPTION

In the following, with reference to the drawings of the embodiments disclosed herein, the technical solutions of the embodiments of the invention will be described in a clear and fully understandable way.

It is noted that the described embodiments are merely a sub-circuit but not all of the embodiments of the invention. Based on the described embodiments of the invention, those ordinarily skilled in the art can obtain other embodiment(s), which come(s) within the scope sought for protection by the invention.

In a first aspect, the present disclosure provides a shift register unit circuit.

According to a first embodiment of the disclosure, the shift register unit circuit comprises an input sub-circuit, a pull-up sub-circuit, a pull-down control sub-circuit, a pull-down sub-circuit, and a voltage regulating sub-circuit.

The input sub-circuit is coupled to a signal input terminal and a pull-up node, and is configured to receive an input signal from the signal input terminal to thereby control a potential of the pull-up node.

The pull-up sub-circuit is coupled to the pull-up node, a first signal terminal and an output terminal, and is configured to output a gate driving signal to the output terminal under control of the potential of the pull-up node and a signal inputted from the first signal terminal.

The pull-down control sub-circuit is coupled to a first node, a second signal terminal, and a pull-down node, and is configured to conduct the pull-down node with the first node under control of a signal inputted from the second signal terminal.

The pull-down sub-circuit is coupled to the pull-up node, the pull-down node, the first node, a turn-down signal terminal, and the output terminal, and is configured to conduct the pull-up node with the first node, and to conduct the turn-down signal terminal with the output terminal, under control of a potential of the pull-down node.

The voltage regulating sub-circuit is coupled to the first node and the turn-down signal terminal, and is configured to conduct the first node with the turn-down signal terminal under control of a potential of the first node.

According to a second embodiment of the disclosure, the shift register unit circuit further comprises a reset sub-circuit, which is coupled to a reset terminal, the pull-up node, the first node, the output terminal, and the turn-down signal terminal, and is configured to conduct the turn-down signal terminal with the output terminal and to conduct the first node with the pull-up node under control of a signal inputted from the reset terminal.

Figure 1A:
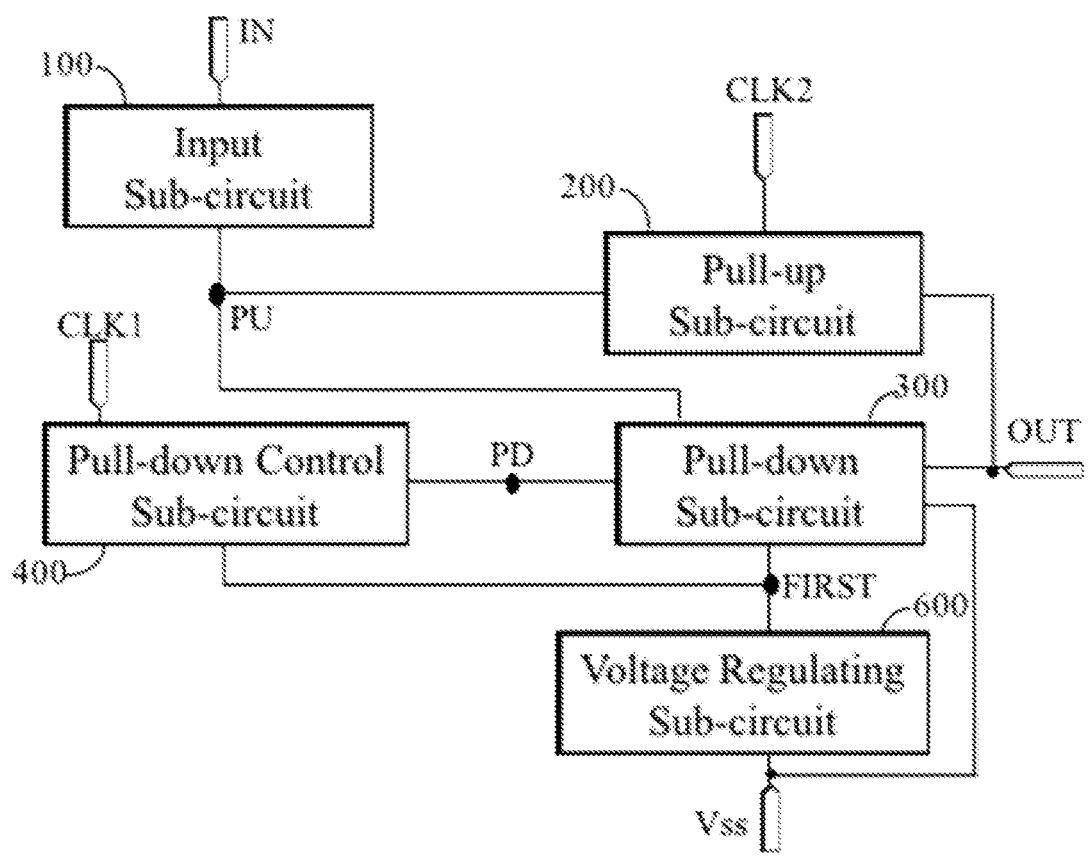
FIG. 1A is a diagram of a shift register unit circuit according to a first embodiment of the present disclosure.

FIG. 1A illustrates a circuit diagram of a shift register unit circuit according to the above mentioned first embodiment of the present disclosure.

As shown in FIG. 1A, the shift register unit circuit comprises a signal input terminal IN, a signal output terminal OUT, a turn-down signal terminal Vss, a first clock signal terminal CLK1, a second clock signal terminal CLK2, an input sub-circuit 100, a pull-up sub-circuit 200, a pull-down sub-circuit 300, a pull-down control sub-circuit 400, and a voltage regulating sub-circuit 600.

An input terminal of the input sub-circuit 100 is coupled (i.e. electrically connected) to the signal input terminal IN; and an output terminal of the input sub-circuit 100 is coupled to a pull-up node PU. The input sub-circuit 100 is configured to receive an input signal from the signal input terminal IN to thereby control a potential of the pull-up node.

An input terminal of the pull-up sub-circuit 200 is coupled to the second clock signal terminal CLK2. An output terminal of the pull-up sub-circuit 200 is coupled to the signal output terminal OUT. A control terminal of the pull-up sub-circuit 200 is coupled to the pull-up node PU.

The pull-up sub-circuit 200 is configured to conduct or electrically couple an input terminal of the pull-up sub-circuit 200 with an output terminal of the pull-up sub-circuit 200 when the control terminal of the pull-up sub-circuit 200 receives a high-level signal from the pull-up node PU. Herein it should be noted that the second clock signal terminal CLK2 is substantially the first signal terminal as mentioned in the first embodiment of the shift register unit circuit.

An input terminal of the pull-down control sub-circuit 400 is coupled to the first clock signal terminal CLK1, and is configured to receive a signal from the first clock signal terminal CLK1. An output terminal of the pull-down control sub-circuit 400 is coupled to the control terminal of the pull-down sub-circuit 300 via a pull-down node PD. The pull-down control sub-circuit 400 is further coupled to a first node FIRST.

By means of the pull-down node PD, the pull-down control sub-circuit 400 is configured to output a low-level signal inputted from the first clock signal terminal CLK1 to the control terminal of the pull-down sub-circuit 300 during an output stage of the shift register unit circuit, and is configured to output a high-level signal inputted from the first clock signal terminal CLK1 to the control terminal of the pull-down sub-circuit 300 during a pull-down stage of the shift register unit circuit.

Herein it should be noted that the first clock signal terminal CLK1 is substantially the second signal terminal as mentioned in the first embodiment of the shift register unit circuit.

An input terminal of the pull-down sub-circuit 300 is coupled to the turn-down signal terminal Vss, and an output terminal of the pull-down sub-circuit 300 is coupled to the signal output terminal OUT. The pull-down sub-circuit 300 is further coupled to the pull-down node PD, the pull-up node PU, and the first node FIRST.

The pull-down sub-circuit 300 is configured to conduct the input terminal of the pull-down sub-circuit 300 with the output terminal of the pull-down sub-circuit 300 when a control terminal of the pull-down sub-circuit 300 receives a high-level signal from the pull-up node PU.

The voltage regulating sub-circuit 600 is disposed between, and is connected to, the input terminal of the pull-down control sub-circuit 400 and the turn-down signal terminal Vss. The voltage regulating sub-circuit 600 is configured to conduct the input terminal of the pull-down control sub-circuit 400 with the turn-down signal terminal Vss during the output stage of the shift register unit circuit, and the voltage regulating sub-circuit 600 is configured to allow single-direction conduction from the input terminal of the pull-down control sub-circuit 400 to the turn-down signal terminal Vss.

Herein the single-direction conduction means that the electric current is allowed to flow from the input terminal of the pull-down control sub-circuit 400 to the turn-down signal terminal Vss, but is not allowed to flow from the turn-down signal terminal Vss to the input terminal of the pull-down control sub-circuit 400.

Figure 1B:
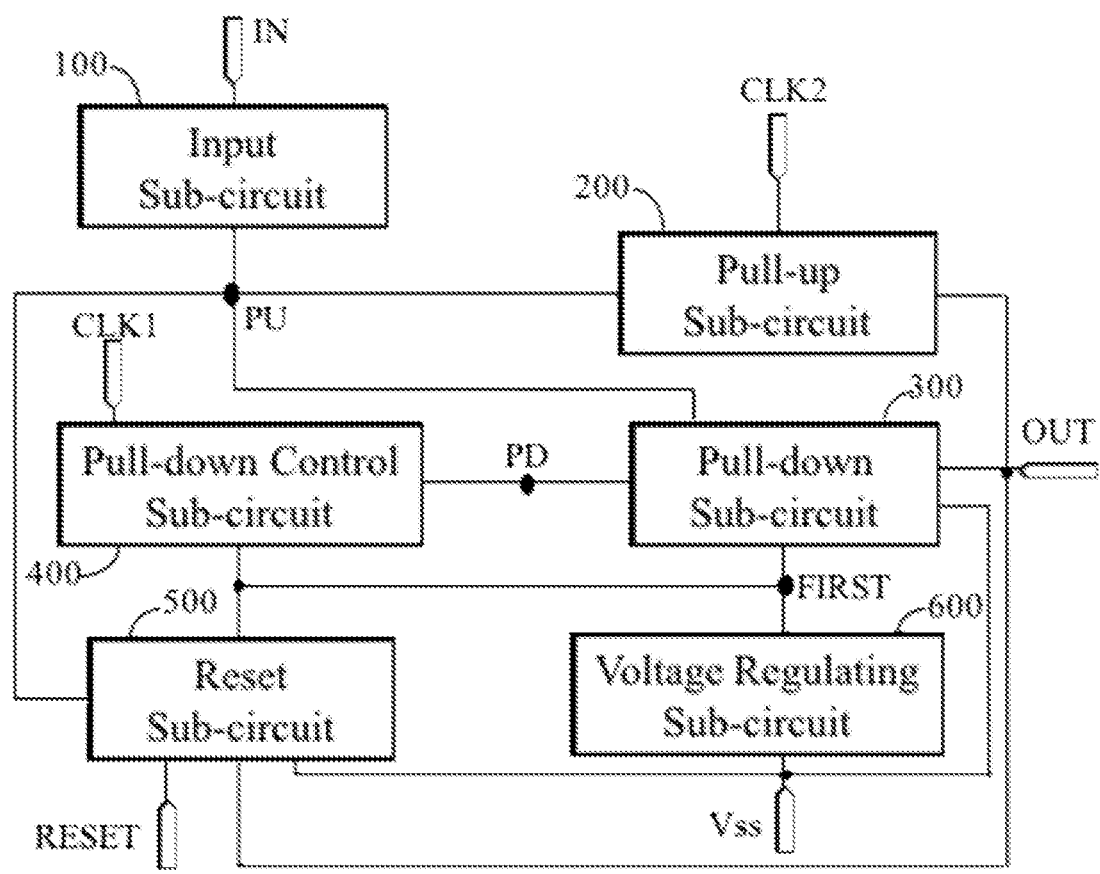
FIG. 1B is a diagram of a shift register unit circuit according to a second embodiment of the present disclosure.

FIG. 1B illustrates a circuit diagram of a shift register unit circuit according to the above mentioned second embodiment of the present disclosure. As shown in FIG. 1B, in addition to the various sub-circuits and various connections included in the first embodiment of the shift register unit circuit as illustrated in FIG. 1A, the shift register unit circuit further comprises a reset sub-circuit 500.

The reset sub-circuit 500 is coupled to a reset terminal RESET, the pull-up node PU, the first node FIRST, the signal output terminal OUT, and the turn-down signal terminal Vss, and is configured to conduct the turn-down signal terminal with the output terminal and to conduct the first node with the pull-up node under control of a signal inputted from the reset terminal.

Figure 3:
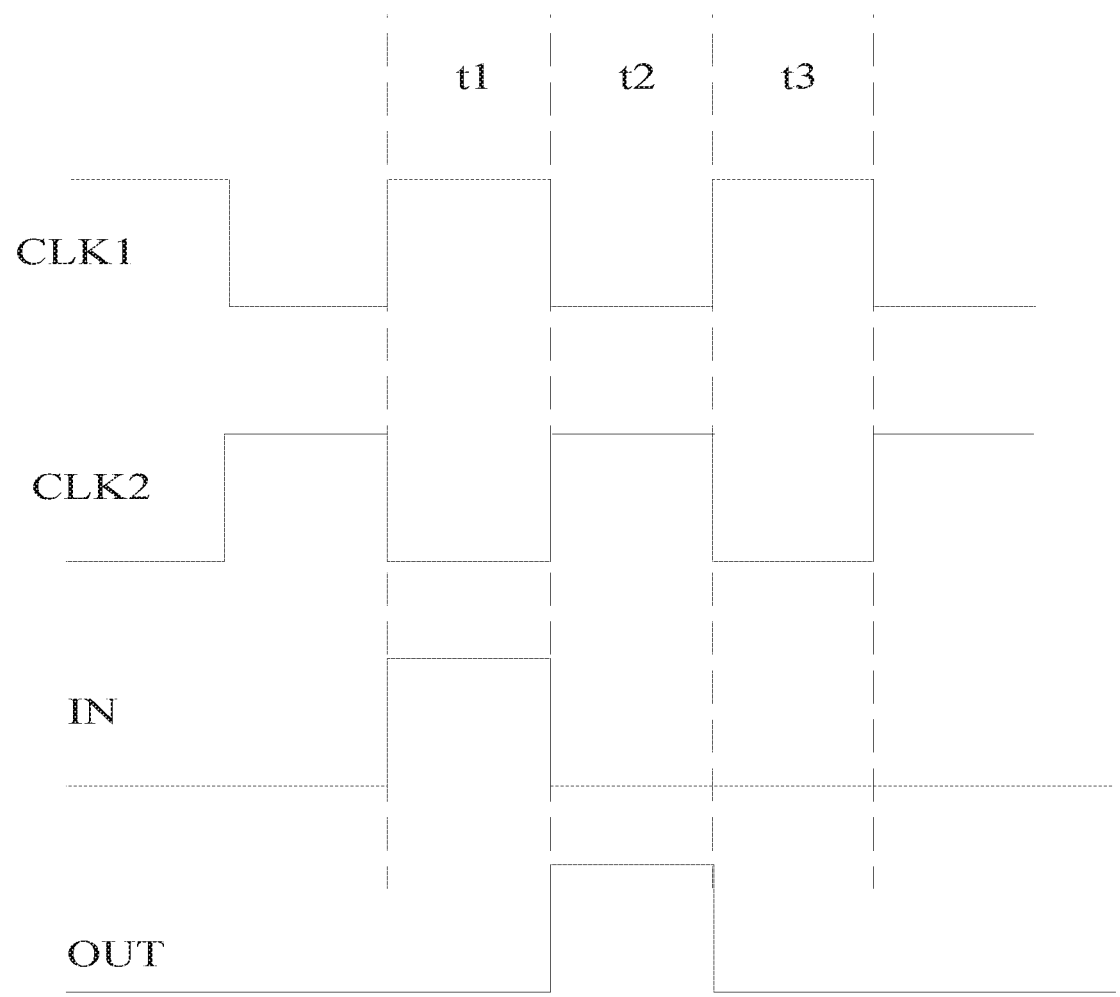
FIG. 3 is a signal time sequence diagram of the shift register unit circuit according to some embodiments of the present disclosure.

As shown in FIG. 3, the working cycle of the shift register unit circuit comprises an input stage t1, an output stage t2, and a pull-down stage t3.

During the input stage t1, the signal input terminal IN receives a high-level signal, and charges the control terminal of the pull-up sub-circuit 200 through the input sub-circuit 100.

During the output stage t2, the input terminal of the pull-up sub-circuit 200 is conducted with the signal output terminal OUT. During this stage, a high-level signal from CLK2 is inputted to the pull-up sub-circuit 200, and the high-level signal is then outputted to the signal output terminal OUT. In addition, during this stage, the pull-down control sub-circuit 400 outputs a low-level signal to the control terminal of the pull-down sub-circuit 300 to thereby ensure the input terminal (coupled with Vss) and the output terminal (coupled with OUT) of the pull-down sub-circuit 300 are disconnected from each other.

During the pull-down stage t3, the pull-down control sub-circuit 400 outputs a high-level signal from CLK1 to the control terminal of the pull-down sub-circuit 300 to thereby conduct the input terminal (coupled with Vss) with the output terminal (coupled with OUT) of the pull-down sub-circuit 300 so that the signal output terminal OUT is discharged. Because the voltage of the signal output terminal OUT decreases gradually during the discharging stage, the electric potential (or level) of the turn-down signal terminal Vss can be pulled up at the same time.

Because the voltage regulating sub-circuit 600 is disposed between, and is connected to, the turn-down signal terminal Vss and the pull-down control sub-circuit 400, and the voltage regulating sub-circuit 600 is configured to only allow single-direction conduction from the input terminal of the be pull-down control sub-circuit 400 to the turn-down signal terminal Vss, thus during the output stage, the low-level voltage at Vss can be pulled up to a high level instantly as a result of the output.

Because of the single-direction conduction function of the voltage regulating sub-circuit 600, the signal at the turn-down signal terminal Vss that is pulled up to a high level cannot be transmitted to the control terminal of the pull-down sub-circuit 300, fluctuation of the voltage at the control terminal of the pull-down sub-circuit 300 can thereby be prevented, which ensures a conduction of the input terminal with the output terminal of the pull-down sub-circuit 300 and a proper shutoff of the gate line. It is beneficial for an improvement of the display effect of a display apparatus comprising the shift register unit circuit.

In addition, the electrical charge stored in the voltage regulating sub-circuit 600 can further ensure the voltage at the terminal of the voltage regulating sub-circuit 600 coupled to the pull-down sub-circuit 300 to be maintained at a low level. As such, the configuration of the voltage regulating sub-circuit 600 can ensure sufficient output of low-level signals and ensure a stable electric potential (or level) of the output terminal of the pull-down sub-circuit 300.

Herein, it is noted that there are no limitations to the specific structures of the voltage regulating sub-circuit 600. For example, the voltage regulating sub-circuit 600 can comprise a diode. An anode of the diode can be connected to the input terminal of the pull-down control sub-circuit 400, and a cathode of the diode can be connected to the turn-down signal terminal Vss.

Figure 2A:
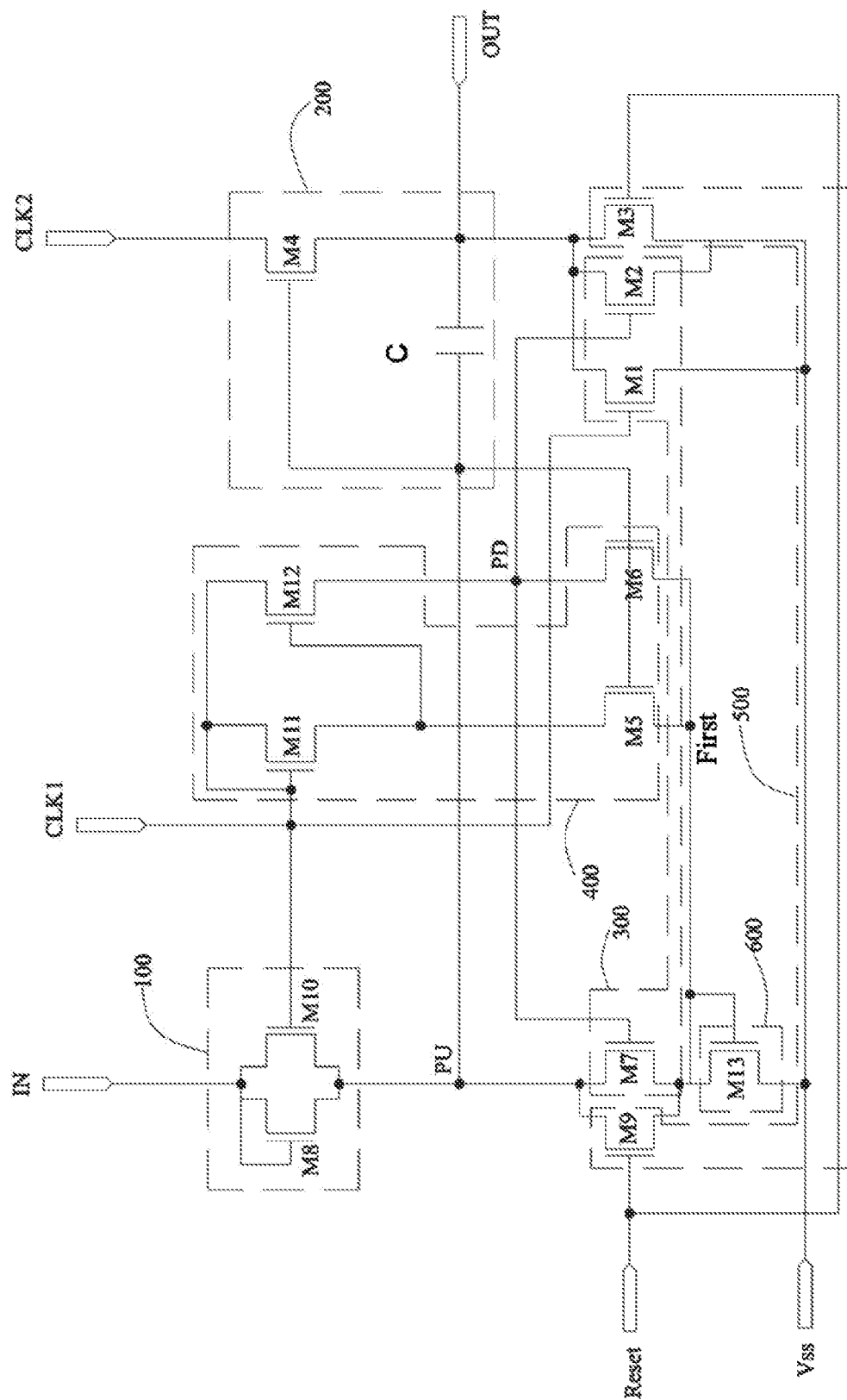
FIG. 2A is a circuit diagram of the shift register unit circuit according to some embodiments of the present disclosure.

FIG. 2A shows a detailed circuit structure diagram of the shift register unit circuit according to some specific embodiment of the disclosure.

As shown in FIG. 2A, the voltage regulating sub-circuit 600 comprises a voltage regulating transistor M13. A first electrode of the voltage regulating transistor M13 is connected to both the turn-down signal terminal Vss and a first input terminal of the reset sub-circuit 500. A second electrode and the gate electrode of the voltage regulating transistor M13 are both connected to a first node (i.e. the first node FIRST in FIG. 1A and FIG. 1B) a second input terminal of the reset sub-circuit 500, and are further connected to the input terminal of the pull-down control sub-circuit 400.

A first output terminal of the reset sub-circuit 500 is connect to the signal output terminal OUT, and a second output terminal of the reset sub-circuit 500 is connected to the control terminal of the pull-up sub-circuit 200.

The gate electrode and the first electrode of the voltage regulating transistor M13 are connected to each other to thereby form a diode connection. As such, when the voltage at the first electrode of the voltage regulating transistor M13 rises, the voltage regulating transistor M13 can form a diode connection, and consequently, backward signal input can be prevented, and the voltage at the second electrode of the voltage regulating transistor M13 can be maintained stable.

The larger a width-length ratio of a channel of a transistor, the smaller a resistance of the transistor. In the present disclosure, in order to reduce the power consumption of the voltage regulating sub-circuit 600, the width-length ratio of the channel of the voltage regulating transistor M13 is preferably larger than or equal to 2.

Herein there are no limitations to the specific structures of the reset sub-circuit 600, as long as the reset functionality can be achieved for the signal output terminal OUT and the control terminal of the pull-up sub-circuit 200 during the pull-down stage t3.

As shown in the embodiment as illustrated in FIG. 2A, the reset sub-circuit 500 further comprises a first reset transistor M3 and a second reset transistor M9.

A first electrode of the first reset transistor M3 forms the first output terminal of the reset sub-circuit 500, and is connected to the signal output terminal OUT. A second electrode of the first reset transistor M3 forms the first input terminal of the reset sub-circuit 500, and is connected to the turn-down signal terminal Vss. A gate electrode of the first reset transistor M3 forms the control terminal of the reset sub-circuit 500, and is connected to the reset terminal Reset.

A gate electrode of the second reset transistor M9 is connected to the gate electrode of the first reset transistor M3, and is thus also connected to the reset terminal Reset. A first electrode of the second reset transistor M9 forms the second output terminal of the reset sub-circuit 500 and is connected to the control terminal of the pull-up sub-circuit

200. A second electrode of the second reset transistor M9 forms the second input terminal of the reset sub-circuit 500 and is connected to the second electrode (and also the gate electrode) of the voltage regulating transistor M13.

The reset terminal Reset is configured to receive a reset signal, and as such, when the reset signal is effective during the output stage of the shift register unit circuit, the first reset transistor M3 and the second reset transistor M9 are both conductive. Because the voltages at both terminals of the voltage regulating transistor M13 are maintained at relatively a low electric potential, the control terminal of the pull-up sub-circuit 200 and the signal output terminal OUT can be reset properly.

In the present disclosure, there are no limitations to the specific structures of the input sub-circuit 100.

In the embodiment as shown in FIG. 2A, the input sub-circuit 100 comprises an input transistor M8. A gate electrode and a first electrode of the input transistor M8 form the input terminal of the input sub-circuit 100, and is connected to the signal input terminal IN. A second electrode of the input transistor M8 forms the output terminal of the input sub-circuit 100, and is connected to the control terminal of the pull-up sub-circuit 200.

When a high-level signal is inputted into the signal input terminal IN, the input transistor M8 is conductive, thereby charging the control terminal of the pull-up sub-circuit 200.

In order to better charge the control terminal of the pull-up sub-circuit 200, the input sub-circuit 100 can further comprise a filter transistor M10. A first electrode of the filter transistor M10 is connected to the first electrode of the input transistor M8. A second electrode of the filter transistor M10 is connected to the second electrode of the input transistor M8. A gate electrode of the filter transistor M10 is connected to the first clock signal terminal CLK1.

As shown in FIG. 3, during the input stage t1, a high-level signal is inputted to the first clock signal terminal CLK1, and consequently, both the pull-up transistor M8 and the filter transistor M10 are conducted, thereby the input signal can charge the control terminal of the pull-up sub-circuit 200 from the signal input terminal IN.

During the output stage t2, the signal inputted to the first clock signal terminal CLK1 is a low-level signal, and consequently, the input transistor M8 is off, and the filter transistor M10 is also off.

During the pull-down stage t3, the signal inputted to the first clock signal terminal CLK1 is a high-level signal, and consequently, the filter transistor M10 is conducted, and the low-level signal inputted from the signal input terminal IN can thus cause the control terminal of the pull-up sub-circuit 200 to discharge.

In the present disclosure, there are no limitations to the specific structures of the pull-up sub-circuit 200.

In the embodiment as shown in FIG. 2A, the pull-up sub-circuit 200 comprises a pull-up transistor M4 and a storage unit C.

A gate electrode of the pull-up transistor M4 forms a control terminal of the pull-up transistor M4. A first electrode of the pull-up transistor M4 is connected to the second clock signal terminal CLK2. A second electrode of the pull-up transistor M4 is connected to the signal output terminal OUT.

One terminal of the storage unit C is connected to the gate electrode of the pull-up transistor M4, and the other terminal of the storage unit C is connected to the second electrode of the pull-up transistor M4.

The first electrode of the pull-up transistor M4 is the input terminal of the pull-up sub-circuit 200, and the second electrode of the pull-up transistor M4 is the output terminal of the pull-up sub-circuit 200.

During the input stage t1, the input sub-circuit 100 charges the storage unit C. During the output stage t2, because of the boot-strapping function of the storage capacitor C, the gate electrode of the pull-up transistor M4 is coupled to a higher level, therefore the pull-up transistor M4 is conducted. At this moment, the second clock signal terminal CLK 2 is inputted with a high-level signal, therefore the high-level signal can be outputted from the signal output terminal OUT to the pull-up transistor M4.

Herein the storage unit C can be a capacitor.

In the present disclosure, there are no limitations to the specific structures of the pull-down sub-circuit 300.

In the embodiment in FIG. 2A, the pull-down sub-circuit 300 comprises a first pull-down transistor M2 and a second pull-down transistor M7.

A gate electrode of the first pull-down transistor M2 forms the control terminal of the pull-down sub-circuit 300, and is connected to the output terminal of the pull-down control sub-circuit 400. A first electrode of the first pull-down transistor M2 forms the output terminal of the pull-down sub-circuit 300, and is connected to the signal output terminal OUT. A second electrode of the first pull-down transistor M2 forms the input terminal of the pull-down sub-circuit 300, and is connected to the turn-down signal terminal Vss.

A gate electrode of the second pull-down transistor M7 is connected to the gate electrode of the first pull-down transistor M2 (and thus is also connected to the PD). A first electrode of the second pull-down transistor M7 is connected to the control terminal of the pull-up sub-circuit 200. A second electrode of the second pull-down transistor M7 is connected to the first node, and is further connected to the input terminal of the pull-down control sub-circuit 400.

The pull-down sub-circuit 300 comprising the first pull-down transistor M2 and the second pull-down transistor M7 can pull down the control terminal of the pull-up sub-circuit 200 and the signal output terminal OUT at the same time during the output stage t2.

Preferably, the pull-down sub-circuit can further comprise a third pull-down transistor M1. A gate electrode of the third pull-down transistor M1 is connected to the first clock signal terminal CLK1. A first electrode of the third pull-down transistor M1 is connected to the first electrode of the first pull-down transistor M2. A second electrode of the third pull-down transistor M1 is connected to the input terminal of the pull-down control sub-circuit 400.

In the present disclosure, there are no limitations to the specific structures of the pull-down control sub-circuit 400.

In the embodiment as shown in FIG. 2A, the pull-down control sub-circuit 400 comprises a first pull-down control transistor M11, a second pull-down control transistor M12, a third pull-down control transistor M5, and a fourth pull-down control transistor M6.

A gate electrode of the first pull-down control transistor M11 is connected to the first clock signal terminal CLK1. A first electrode of the first pull-down control transistor M11 is connected to the gate electrode of the first pull-down control transistor M11. A second electrode of the first pull-down control transistor M11 is connected to a first electrode of the third pull-down control transistor M5.

A gate electrode of the second pull-down control transistor M12 is connected to the second electrode of the first pull-down control transistor M11. A first electrode of the second pull-down control transistor M12 is connected to the first electrode of the first pull-down control transistor M11.

A second electrode of the second pull-down control transistor M12 is connected to the control terminal of the pull-down sub-circuit 300.

A gate electrode of the third pull-down control transistor M5 is connected to the control terminal of the pull-up sub-circuit 200. A second electrode of the third pull-down control transistor M5 is connected to a second electrode of the fourth pull-down control transistor M6 via the first node and forms the input terminal of the pull-down control sub-circuit 400 which is connected to one terminal of the voltage regulating sub-circuit 600 (i.e. the second electrode and the gate electrode of the voltage regulating transistor M13).

A gate electrode of the fourth pull-down control transistor M6 is connected to the gate electrode of the third pull-down control transistor M5. A first electrode of the fourth pull-down control transistor M6 is connected to the control terminal of the pull-down sub-circuit 300.

In the following, the working principle of the shift register unit circuit as illustrated in FIG. 2A will be described in detail with reference to FIG. 2A and FIG. 3.

During the input stage t1, the first clock signal is a high-level signal, the second clock signal is a low-level signal, and the input signal is a high-level signal. The input transistor M8 is conducted with the filter transistor M10, the storage unit C of the pull-up sub-circuit 200 is charged, and at this moment, the pull-up transistor M4 is conducted, and the second clock signal is a low electric potential. As such, the signal output terminal OUT of the shift register unit circuit outputs a low electric potential (i.e. a low level) during the input stage t1.

At the same time, the first pull-down control transistor M11 is conducted, thereby the second pull-down control transistor M12 is conducted. At the same time, the third pull-down control transistor M5 is conducted with the fourth pull-down control transistor M6, and the voltage regulating transistor M13 is conducted. As such, a low-level signal is outputted to the control terminal of the pull-down sub-circuit 300, and the first pull-down transistor M2 and the second pull-down transistor M7 are both off. The third pull-down transistor M1 is conducted, leading to a conduction of the signal output terminal OUT with the turn-down signal terminal Vss, which can further ensure that the signal output terminal OUT outputs a low-level signal.

During the output stage t2, the input signal is a low-level signal, the storage unit C bootstraps to thereby cause the control terminal of the pull-up sub-circuit 200 to be coupled to a higher electric potential (i.e., higher level). Consequently, the pull-up transistor M4 is conducted, the second clock signal is high-level signal, and the signal output terminal OUT outputs a high electric potential.

Because the first clock signal is a low-level signal, the first pull-down control transistor M11 and the second pull-down control transistor M12 are both off, and the third pull-down control transistor M5 is conducted with the fourth pull-down control transistor M6. Consequently, the control terminal of the pull-down sub-circuit 300 is conducted with both the gate electrode and the first electrode of the voltage regulating transistor M13, the electric potential of the control terminal of the pull-down sub-circuit 300 is also pulled down, and the first pull-down transistor M2, the second pull-down transistor M7, and the third pull-down transistor M1 are all off, thereby ensuring that the signal output terminal OUT outputs a high-level signal during the output stage t2.

During the pull-down stage t3, the first clock signal is a high-level signal, thereby the first pull-down control transistor M11 is conducted with the second pull-down control transistor M12, pulling up the electric potential of the control terminal of the pull-down sub-circuit 300 to a high electric potential.

At this moment, the first pull-down transistor M2, the second pull-down transistor M7, and the third pull-down transistor M1 are all conducted, thereby pulling down both the signal output terminal OUT and the control terminal of the pull-up sub-circuit 200. The reset terminal Reset receives a high-level signal, causing a conduction of the first reset transistor M3 with the second reset transistor M9, thereby pulling down the signal output terminal OUT and the control terminal of the pull-up sub-circuit 200.

Figure 2B:
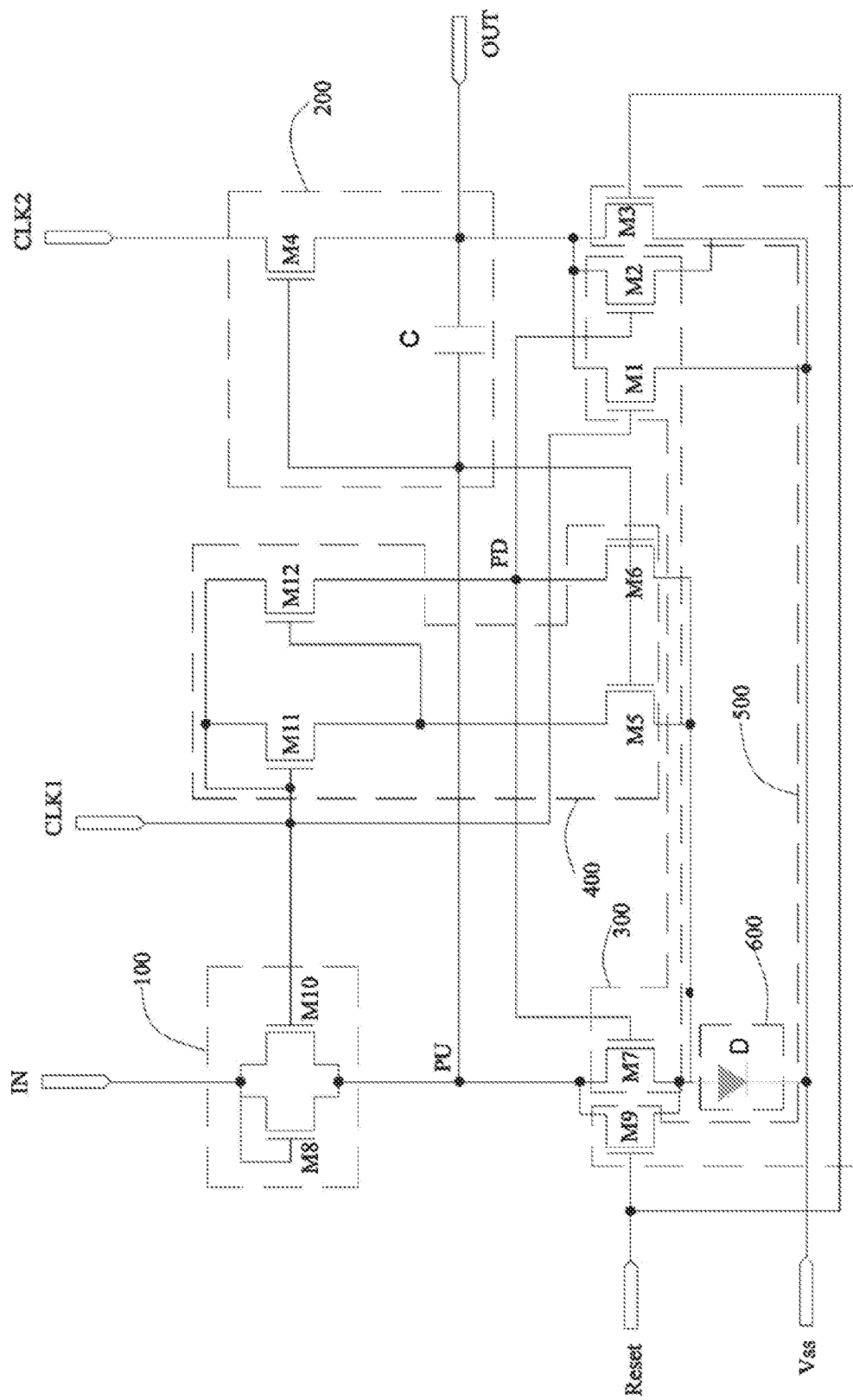
FIG. 2B is a circuit diagram of the shift register unit circuit according to some other embodiments of the present disclosure.

FIG. 2B shows a circuit diagram of the shift register unit circuit according to some other embodiments of the present disclosure. It is noted that all elements and connections as shown in FIG. 2B are identical to the elements and connections as shown in FIG. 2A except for the voltage regulating sub-circuit 600.

In the embodiments as shown in FIG. 2B, the voltage regulating sub-circuit 600 comprises a diode D. An anode of the diode is connected to the input terminal of the pull-down control sub-circuit 400, and a cathode of the diode can be connected to the turn-down signal terminal Vss.

In a second aspect, the present disclosure further provides a shift register. The shift register comprises cascaded multi-level shift register unit circuits, and at least one of the shift register unit circuits is the shift register unit circuit as described above in the present disclosure.

Preferably, all the shift register unit circuits in the shift register are the shift register unit circuits provided by present disclosure.

In a third aspect, the present disclosure further provides a gate drive circuit. The gate drive circuit comprises at least one shift registers, and one or more of the at least one shift registers is the shift register as described above in the present disclosure.

In a fourth aspect, the present disclosure further provides a display apparatus. The display apparatus comprises a gate drive circuit, and the gate drive circuit is the gate drive circuit as described above in the present disclosure.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A shift register unit circuit, comprising:
   an input sub-circuit coupled to a signal input terminal and a pull-up node, the input sub-circuit including an input transistor and a filter transistor, the input sub-circuit being configured to receive an input signal from the signal input terminal to thereby control a potential of the pull-up node;
   a pull-up sub-circuit having a storage unit and a pull-up transistor, the pull-up sub-circuit being coupled to the pull-up node, a first signal terminal and an output terminal, the pull-up sub-circuit being provided between the pull-up node and the output terminal, the pull-up sub-circuit being configured to output a gate driving signal to the output terminal under control of the potential of the pull-up node and a signal inputted from the first signal terminal;

a pull-down control sub-circuit coupled to the filter transistor of the input sub-circuit, a first node, a second signal terminal, and a pull-down node, the pull-down control sub-circuit including a plurality of pull down control transistors including a first pull-down control transistor M11, a second pull-down control transistor M12, a third pull-down control transistor M5 and a fourth pull-down control transistor M6, the pull-down control sub-circuit being provided between the input sub-circuit and the pull down node and between the input sub-circuit and the first node, the pull-down control sub-circuit being configured to conduct the pull-down node with the first node under control of a signal inputted from the second signal terminal;

a pull-down sub-circuit having a plurality of pull-down transistors including a first pull-down transistor M2, a second pull-down transistor M7, and a third pull-down transistor M1, the pull-down sub-circuit being coupled to the pull-up node, the pull-down node, the first node, a turn-down signal terminal Vss, and the output terminal, wherein at least one pull-down transistor of the pull-down sub-circuit is provided between the pull-up node and the first node, the pull-down sub-circuit being configured to conduct the pull-up node with the first node, and to conduct the turn-down signal terminal Vss with the output terminal, under control of a potential of the pull-down node;

a voltage regulating sub-circuit having a voltage regulating transistor M13, the voltage regulating transistor M13 being coupled to and between the first node and the turn-down signal terminal Vss, wherein the voltage regulating transistor M13 has a first electrode being connected to the turn-down signal terminal Vss, and a second electrode of the voltage regulating transistor M13 being connected to the first node, and a gate electrode of the voltage regulating transistor M13 being connected to the first node, wherein the voltage regulating sub-circuit being configured to conduct the first node with the turn-down signal terminal Vss under control of a potential of the first node: and wherein:

the first pull-down transistor M2 is provided between the turn-down signal terminal Vss and the pull-down node and the output terminal;

the second pull-down transistor M7 is provided between the pull-up node and the first node;

the first pull-down control transistor M1 is provided between the second signal terminal and the first node; and the second pull-down control transistor M12 is provided between the second signal terminal and the pull-down node; and wherein the voltage regulating sub-circuit has a single-direction conduction function such that signals at the turn-down signal terminal Vss that are pulled up to a high level are prevented from transmitting to a control terminal of the pull-down sub-circuit, thereby preventing voltage fluctuations at the control terminal of the pull-down sub-circuit, and ensuring a conduction between an input terminal of the pull-down sub-circuit and an output terminal of the pull-down sub-circuit and a proper shutoff of gate lines;

wherein a gate electrode of the second pull-down transistor M7 is coupled to the pull-down node and the fourth pull-down control transistor M6, a first electrode of the second pull-down transistor M7 is coupled to the pull-up node, and a second electrode of the second pull-down transistor M7 is coupled to the first node and the third pull-down control transistor M5.

2. The shift register unit circuit of claim 1, further comprising a reset sub-circuit having one or more reset transistors, the reset sub-circuit having at least one transistor being coupled to a reset terminal, the pull-up node, the first node, the output terminal, and the turn-down signal terminal Vss, wherein at least one reset transistor is provided between the pull-up node and the reset terminal, the reset sub-circuit being configured to conduct the turn-down signal terminal Vss with the output terminal and to conduct the first node with the pull-up node under control of a signal inputted from the reset terminal.

3. The shift register unit circuit of claim 1, wherein the voltage regulating transistor M13 of the voltage regulating sub-circuit is arranged such that:
    a first electrode of the voltage regulating transistor M13 is coupled to the turn-down signal terminal Vss;
    a second electrode and a gate electrode of the voltage regulating transistor M13 are coupled to each other and are both coupled to the first node.

4. The shift register unit circuit of claim 3, wherein a width-length ratio of a channel of the voltage regulating transistor M13 is larger than or equal to two.

5. The shift register unit circuit of claim 1, wherein the voltage regulating sub-circuit comprises a diode, wherein:
    an anode of the diode is coupled to the first node; and
    a cathode of the diode is coupled to the turn-down signal terminal Vss.

6. The shift register unit circuit of claim 1, wherein the input sub-circuit comprises the input transistor having a gate electrode, a first electrode and a second electrode, wherein:
    the gate electrode and the first electrode of the input transistor are coupled to each other and are both coupled to the signal input terminal; and
    the second electrode of the input transistor is coupled to the pull-up node.

7. The shift register unit circuit of claim 6, wherein the filter transistor of the input sub-circuit is arranged such that:
    a first electrode of the filter transistor is coupled to the first electrode of the input transistor;
    a second electrode of the filter transistor is coupled to the second electrode of the input transistor; and
    a gate electrode of the filter transistor is coupled to the second signal terminal.

8. The shift register unit circuit of claim 1, wherein the pull-up transistor and the storage unit of the pull-up sub-circuit are arranged such that:
    a gate electrode of the pull-up transistor is coupled to the pull-up node, a first electrode of the pull-up transistor is coupled to the first signal terminal, and a second electrode of the pull-up transistor is coupled to the output terminal; and
    one terminal of the storage unit is coupled to the gate electrode of the pull-up transistor, and another terminal of the storage unit is coupled to the second electrode of the pull-up transistor.

9. The shift register unit circuit of claim 8, wherein the storage unit comprises a capacitor.

10. The shift register unit circuit of claim 1, wherein
    a gate electrode of the first pull-down transistor M2 is coupled to the pull-down node, a first electrode of the first pull-down transistor M2 is coupled to the output terminal, and a second electrode of the first pull-down transistor M2 is coupled to the turn-down signal terminal Vss.

11. The shift register unit circuit of claim 10, wherein:
a gate electrode of the third pull-down transistor is coupled to the second signal terminal;
a first electrode of the third pull-down transistor is coupled to the first electrode of the first pull-down transistor M2; and
a second electrode of the third pull-down transistor is coupled to the second electrode of the first pull-down transistor M2.

12. The shift register unit circuit of claim 1, wherein:
a gate electrode of the first pull-down control transistor M11 is coupled to the second signal terminal, a first electrode of the first pull-down control transistor M11 is coupled to the gate electrode of the first pull-down control transistor M11, and a second electrode of the first pull-down control transistor M11 is coupled to a first electrode of the third pull-down control transistor M5;
a gate electrode of the second pull-down control transistor M12 is coupled to the second electrode of the first pull-down control transistor M11, a first electrode of the second pull-down control transistor M12 is coupled to the first electrode of the first pull-down control transistor M11, and a second electrode of the second pull-down control transistor M12 is coupled to the pull-down node;
a gate electrode of the third pull-down control transistor M5 is coupled to the pull-up node, and a second electrode of the third pull-down control transistor M5 is coupled to the first node; and
a gate electrode of the fourth pull-down control transistor M6 is coupled to the gate electrode of the third pull-down control transistor M5, a first electrode of the fourth pull-down control transistor M6 is coupled to the pull-down node, and a second electrode of the fourth pull-down control transistor M6 is coupled to the first node.

13. The shift register unit circuit of claim 2, wherein the reset sub-circuit comprises a first reset transistor and a second reset transistor, wherein:
a first electrode of the first reset transistor is coupled to the output terminal, a second electrode of the first reset transistor is coupled to the turn-down signal terminal Vss, and a gate electrode of the first reset transistor is coupled to the reset terminal; and
a gate electrode of the second reset transistor is coupled to the gate electrode of the first reset transistor, a first electrode of the second reset transistor is coupled to the pull-up node, and a second electrode of the second reset transistor is coupled to the first node.

14. The shift register unit circuit of claim 1, wherein:
the first signal terminal is configured to provide a low-level signal during an input stage, a high-level signal during an output stage, and a low-level signal during a pull-down stage;
the second signal terminal is configured to provide a high-level signal during the input stage, a low-level signal during the output stage, and a high-level signal during the pull-down stage; and
the signal input terminal is configured to provide a high-level signal during the input stage, a low-level signal during the output stage, and a low-level signal during the pull-down stage.

15. The shift register unit circuit of claim 1, wherein at least one of the first signal terminal and the second signal terminal is a clock signal terminal.

16. A method for driving a shift register unit circuit according to claim 1, comprising an input stage, an output stage, and a pull-down stage, wherein:
during the input stage, the first signal terminal provides a low-level signal, the second signal terminal provides a high-level signal, and the signal input terminal provides a high-level signal;
during the output stage, the first signal terminal provides a high-level signal, the second signal terminal provides a low-level signal, and the signal input terminal provides a low-level signal; and
during the pull-down stage, the first signal terminal provides a low-level signal, the second signal terminal provides a high-level signal, and the signal input terminal provides a low-level signal.

17. A shift register, comprising at least one shift register unit circuit, wherein one or more of the at least one shift register unit circuit is the shift register unit circuit according to claim 1.

18. The shift register of claim 17, further comprising a plurality of shift register circuit units, wherein the plurality shift register unit circuits are cascaded.

* * * * *